United States Patent [19]

Vitins

[11] 4,063,163
[45] Dec. 13, 1977

[54] APPARATUS FOR LOCALIZATION OF A LINE FAULT THROUGH THE USE OF PREDETERMINABLY SHIFTABLE REFERENCE LOCATION

[75] Inventor: Michael Vitins, Zurich, Switzerland

[73] Assignee: BBC Brown Boveri & Company Limited, Baden, Switzerland

[21] Appl. No.: 691,142

[22] Filed: May 28, 1976

[30] Foreign Application Priority Data

June 12, 1975 Switzerland .......................... 7593/75

[51] Int. Cl.² .......................................... G01R 31/08
[52] U.S. Cl. ..................................................... 324/52
[58] Field of Search ................. 324/51, 52; 317/36 D; 179/175.3 F

[56] References Cited

U.S. PATENT DOCUMENTS

| | | | |
|---|---|---|---|
| 3,255,406 | 6/1966 | Schluter | 324/52 |
| 3,408,564 | 10/1968 | Hoel | 324/52 |
| 3,590,368 | 6/1971 | Esclangon | 324/51 |
| 3,612,989 | 10/1971 | Souillard | 324/52 |
| 3,710,240 | 1/1973 | Kuehnemann et al. | 324/52 |
| 3,800,215 | 3/1974 | Souillard | 324/52 |
| 3,878,460 | 4/1975 | Nimmersjo | 324/52 |

Primary Examiner—Gerard R. Strecker
Attorney, Agent, or Firm—Werner W. Kleeman

[57] ABSTRACT

An apparatus for the localization of a fault on a line wherein there is formed from at least one measurement signal derived from a line voltage and at least one measurement current derived from a line current an evaluation signal characterizing the direction and/or distance of a fault location with respect to a reference location on the line determinable by at least one regulation or adjustment magnitude, the apparatus comprising a voltage- and current measuring device provided at the measurement location and a signal processing- and evaluation circuit. The signal processing- and evaluation circuit possesses at least one reference location-adjustment input and there is provided means defining an operative connection, which changes the momentarily effective reference location adjustment, between an output of the evaluation circuit and the reference location-adjustment input.

4 Claims, 3 Drawing Figures

APPARATUS FOR LOCALIZATION OF A LINE FAULT THROUGH THE USE OF PREDETERMINABLY SHIFTABLE REFERENCE LOCATION

BACKGROUND OF THE INVENTION

The present invention relates to a new and improved construction of apparatus for the localization of a fault on a line wherein there is formed from at least one measurement voltage signal derived from a line voltage and at least one measurement current signal derived from a line current an evaluation signal characterizing the direction and/or distance of a fault location with respect to a reference location on the line which is determinable or controlled by at least one adjustment magnitude.

The present invention is an improvement upon the apparatus disclosed in the commonly assigned, copending United States application Ser. No. 677,685, filed Apr. 16, 1976, of Otto Lanz and Michael Vitins, entitled "Process And Apparatus For Locating Faults On A Line," the disclosure of which is incorporated herein by reference.

In U.S. Pat. No. 3,590,368 there is disclosed an apparatus for localization of a fault on a line wherein at two measurement locations there is formed from the line voltage and the line current a respective traveling wave signal, i.e. a signal, the temporal progression thereof i.e. its course as a function of time corresponds to that of a traveling wave at the measurement location traveling on the line. Thus, at both measurement locations there are traveling wave signals associated with the same direction of propagation, which then are compared with one another by means of a special control line. The thus determined damping of a traveling wave moving from one measurement location to the other provides an indication regarding the presence of a fault within the line section between both measurement locations, thus renders possible fault localization. What is of disadvantage is the requirement for two measurement stations and a special control line as well as the prerequisite of sinusoidal measurment- and traveling wave signals for the damping determination. The last-mentioned prerequisite requires the suppression of the initially strong transient upper harmonics of the line voltage and the line current which follow the occurrence of a fault or the expiration of a sufficient time interval for the decay of such upper harmonics. Both of these conditions are undesired in consideration of the strived for fault localization without any time delay.

There is disclosed in the previously mentioned copending application an apparatus for locating faults which enables monitoring a line section or in fact a number of such sections for faults from a single measurement location, these line sections being bounded by reference locations on the line which are freely determinable i.e. controlled by means of regulation or adjustment magnitudes at a single measurement station. The fault direction determination with respect to two neighboring reference locations or with respect to the measurement location and the neighboring reference location already provides localization of the fault. On the other hand, especially also when selecting only one reference location, it is possible with such apparatus to carry out a fault localization by fault direction determination with respect to a reference location or also the measurement location in connection with a fault distance determination with respect to the reference location or measurement location. There is thus either necessary a twofold evaluation process with two different reference location adjustments or for the measurement location and a reference location adjustment or a distance determination in addition to a direction determination. The distance determination in cases where the fault location is at a greater distance from the reference location does place comparatively great requirements upon the precision of the circuitry if there is required the same absolute fault limits as with lesser distances, and under circumstances also requires longer integration times during the signal processing.

On the other hand, the fault direction determination with respect to a reference location for fault locations near or in the direct neighborhood of such reference location is associated with uncertainty. This is so because the course of the evaluation signal over the fault location-reference location distance, upon coincidence of the fault location and reference location, generally passes through null and thus the evaluation signal at the neighborhood of this null cross-over merges with the disturbance signal peak.

Therefore problems exist both for exceedingly closely situated faults and also for remotely located faults relative to a reference location as concerns the reliability of the direction determination and the distance accuracy.

SUMMARY OF THE INVENTION

It is a primary object of the present invention to provide an apparatus rendering possible fault localization with only one predetermined reference location regulation or adjustment and with comparatively low accuracy requirements placed upon the circuitry.

A further object of the invention is to render possible a positive direction determination for the location of the fault in the neighborhood of a reference location equally with comparatively low accuracy requirements placed upon the circuitry, and wherein the application of the invention is not limited to equipment working with only one reference location.

Now in order to implement these objects and others which will become more readily apparent as the description proceeds, the apparatus for fault localization on a line as contemplated by the invention comprises a voltage- and current-measurement device provided at the measurement location, a signal processing- and evaluation circuit, the signal processing- and evaluation circuit possessing at least one reference location-adjustment input, and means defining an operative connection between an output of the evaluation circuit and the reference location-adjustment input, said operative connection means changing the momentarily effective reference location adjustment.

In accordance with the invention there is realized a feedback loop which —starting from a predetermined starting or initial value of the reference location position— brings about a displacement of the reference location towards the fault location or away from such. The feedback loop is suitable for an iterative mode of operation and can shift the reference location, with a displacement direction towards the fault location, until there is a complete or approximate coincidence with the fault location.

Both displacement directions of the reference location out of its starting position can be employed in practice and in each instance render possible realizing certain advantages. Thus, a displacement towards the fault location is generally advantageous for a determination of the fault distance in terms of a magnitude because the accuracy of the fault location determination generally increases with decreasing fault location-reference location distance. Conversely, a direction determination derived from the sign of the evaluation signal for the fault location at the one or other side of the reference location in the direct neighborhood of the reference location is associated with uncertainty if the evaluation signal as a function of the fault location-reference location distance together with such, while changing its sign, continuously passes through null. Undertaking a reference location displacement towards the fault location, with incipient false direction decision, then also leads to an oscillation of the reference location about a region containing the fault location or —even under unfavorable conditions— is located at the direct neighborhood of the fault location, so that the latter again can be more narrowly limited. On the other hand, shifting of the reference location away from the fault location, even with incipient false direction decision —then after passing through the uncertainty region— leads to an increasing distance from the fault location, so that the direction determination or decision after leaving the uncertainty region again is reliable. The fault location further also can be determined by an evaluation of the changing direction of the fault location-reference location distance during the reference location displacement.

The present objects and solution therefore has applicability, beyond the subject matter of the indicated copending application, basically for all circuits serving for fault localization with adjustable reference location.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE INVENTION

Figure 1:
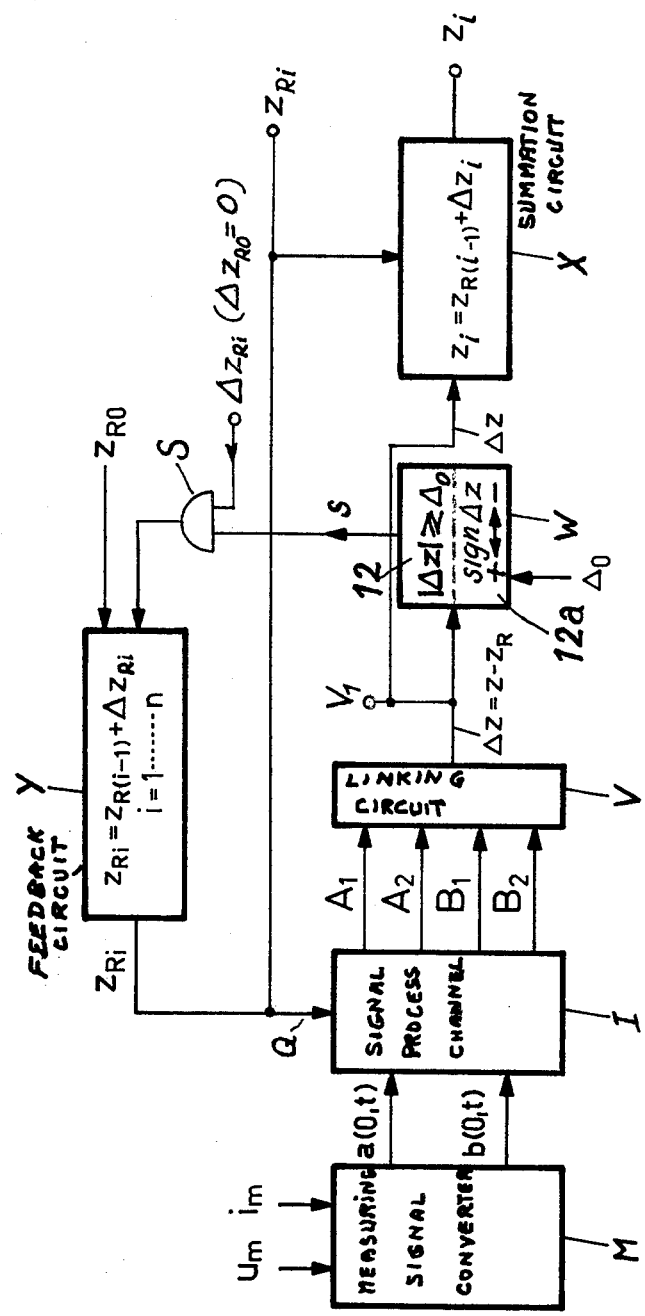
FIG. 1 is a block and functional diagram of an apparatus for fault localization with iterative reference location-displacement.
Figure 2:
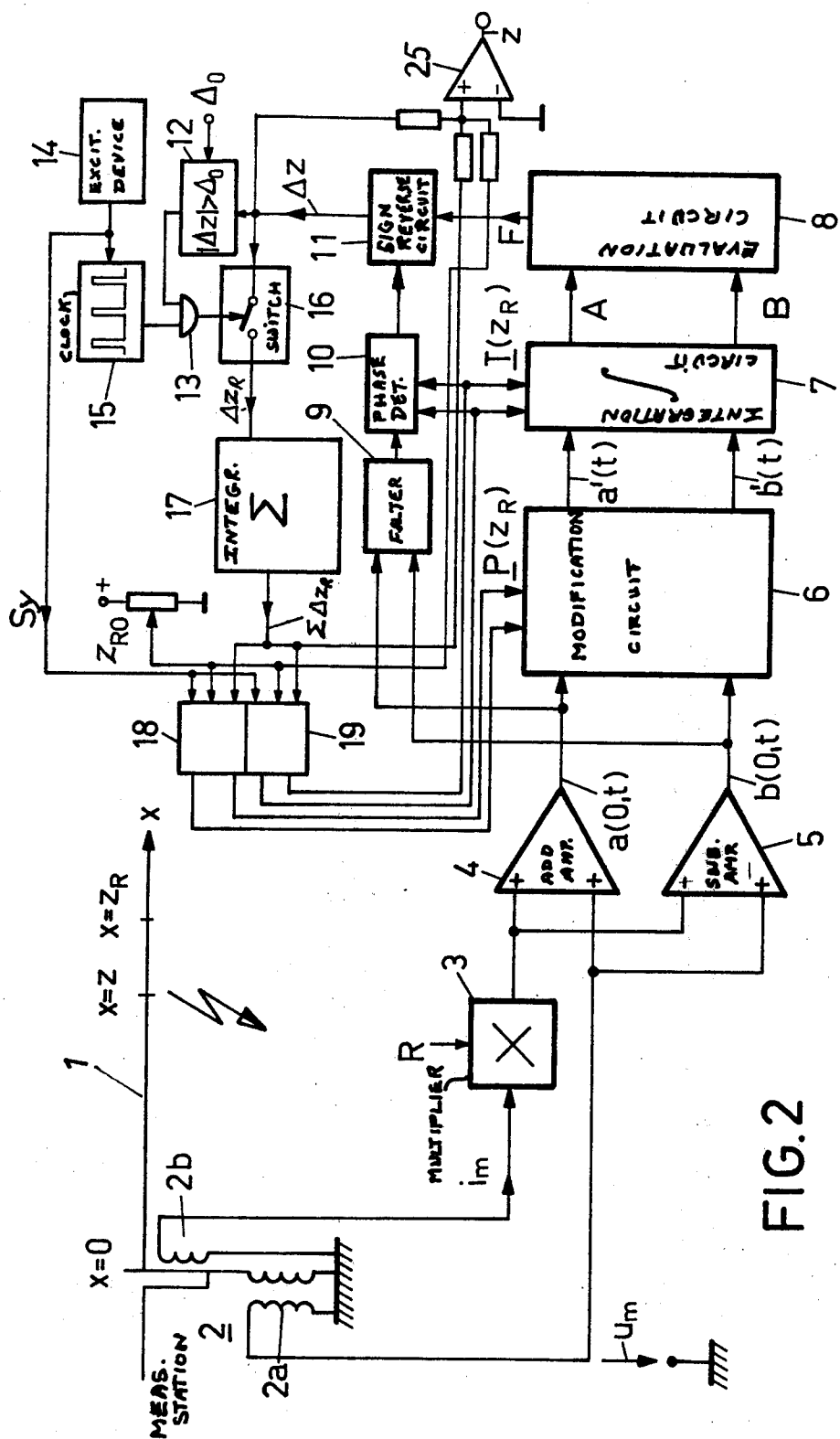
FIG. 2 is a block circuit diagram of the apparatus of FIG. 1.

Describing now the drawings, according to FIG. 1 there is delivered to a measurement signal converter M a measurement voltage signal $u_m$ derived from a line voltage and a measurement current signal $i_m$ derived from a line current. From these signals $u_m$, $i_m$ there are formed in the measurement signal converter M two oppositely moving traveling wave signals $a(O,t)$ and $b(O,t)$ valid for a line location, especially a measurement or measuring location having the longitudinal coordinate $x = O$ (FIG. 2). From such traveling wave signals there are formed in a signal processing circuit I containing an integrator, for both wave propagation directions on the line, two time integrals $A_1$, $A_2$ and $B_1$, $B_2$ respectively, of the relevant traveling wave signals. The traveling wave-time integrals for each respective propagation direction can differ for instance by the position of their integration time intervals. Such a multiple-integration of each such traveling wave signal renders possible, as indicated in detail in the aforementioned copending application, elimination of ambiguities of the direction determination for the fault location relative to a reference location in consideration of the momentary position of the integration time intervals within the periods of a dominant frequency component of the traveling wave signals, for example, the network frequency components in the case of alternating-current lines.

Additionally, in the signal processing circuit I, which for this purpose possesses an appropriate adjustment or regulation input Q, there is fixed a reference location $z_R$, with respect to which there occurs the distance- and/or direction determination. The momentarily effective reference location specifically can be determined by a mutual displacement or also a length difference of the integration time intervals and/or mutual dislasement and/or different weighting (especially in the sense of a multiplication with time weighting functions) for the oppositely moving traveling wave signals. However, it is also basically sufficient for the present invention that there is provided a reference location which can be adjusted by suitable signals for carrying out the fault distance- or fault direction determination.

There follows a linking or evaluation circuit V receiving the traveling wave time integrals, which for instance as described in the aforementioned copending application, forms an evaluation signal $\Delta z = z - z_R$ which as a function of its sign and magnitude determines the direction and the distance of a fault location $z$ relative to the reference location $z_R$. This evaluation signal is basically available already at an output $V_1$ for triggering protective measures, but in the case under discussion is further delivered to a comparison circuit W which in a first parallel channel 12 compares the magnitude of the evaluation function with a predetermined boundary value or in a second parallel channel 12a determines the sign of this evaluation signal. In both instances there is formed, as a function of the comparison result, a binary control signal $s$ according to the following relationship:

$$|\Delta z| > \Delta_0 \rightarrow s = 1, |\Delta z| < \Delta_0 \rightarrow s = 0 \text{ and} \quad (1)$$

$$\text{sign } \Delta z = + \rightarrow s = 1, \text{ sign } \Delta z = - \rightarrow s = 0. \quad (2)$$

The feedback loop is closed by a feedback circuit Y to which there is delivered, apart from a reference location-initial value $z_{RO}$, by means of an AND-gate S a reference location-displacement step $\Delta z_{Ri}$ and which forms therefrom an adjustment or regulating signal corresponding to the momentarily effective reference location $z_{Ri}$ and delivered to a reference location-adjustment or regulation input Q. This adjustment signal, apart from the momentarily valid evaluation signal, is supplied to a summation circuit X which thus forms a fault location signal corresponding to the momentarily valid fault location $z_i$.

By virtue of the blocking or switching-through of the displacement step signal by means of the AND-gate S as indicated in FIG. 1 the mode of the operation of the feedback loop is as follows: In the starting condition, prior to occurrence of a fault, the feedback circuit Y carries at its output side the adjustment or regulating signal $z_{RO}$, because the AND-gate S is initially blocked and there is thus valid for $\Delta z_{RO} = 0$. After occurrence of the fault there is therefore valid the first formed evaluation signal $\Delta z$ for the reference location $z_{RO}$. This fault location-reference location distance may be greater than the boundary value $\Delta_0$ which generally is adjusted to be comparatively low. Upon connection of the output of the comparison circuit W with the first parallel channel 12 there appears a yes-type control signal $s$, so that via the AND-gate S and the feedback circuit Y there is initiated a first displacement step of the reference location. With corresponding directional sense this displacement occurs in the direction of the fault location, so that the fault location-reference location distance is decreased. This iterative reference location displacement is continued until the magnitude of the corresponding evaluation signal drops below the boundary value $\Delta_0$. The fault location, while only taking into account the momentarily valid reference location determined at a higher speed, is narrowed to a boundary region around the reference location and corresponding to this boundary value. With a sufficiently low set boundary value there thus can be obtained at the associated output $z_{Ri}$ a final fault location signal. The result is governed by the relationship:

$$z_{Ri} = z_{R(i-1)} + \Delta z_{Ri}, \quad i = 1 \ldots n \tag{3}$$

and with comparatively high set boundary value there is recommended an explicit determination of the fault location $z_n$ according to the relationship:

$$z_n = z_{R(n-1)} + \Delta z_n. \tag{4}$$

Furthermore, the momentarily valid evaluation signal and the momentarily valid reference location signal are delivered to the summation circuit X, the output of which delivers a signal corresponding to the previously mentioned relationship and, if necessary can be released by a non-illustrated logic circuit as a function of reaching the aforementioned boundary value as the validity criterion.

The reference location-displacement steps introduced via the AND-gate S can be moreover made dependent according to their momentary values, by an appropriate connection to the output of the linking circuit V, upon the magnitude of the momentary fault location-reference location distance. In this way there is realized a more sensitive displacement of the reference location while progressively approaching the fault location. In particular there can be then predetermined a number of displacement steps and thus there can be realized a saving in a comparison circuit for completing the reference location displacement.

Upon deriving the control signal $s$ from the second parallel channel 12$a$ of the comparison circuit W according to equation (2) the iterative mode of operation of the feedback loop follows the same scheme provided the polarity and therefore the direction of the displacement steps are determined according to the binary values of the control signal $s$ and the polarity moreover is associated with the fault location as a function of moving closer to the reference location. In place of the AND-gate S indicated in FIG. 1 there is then provided a polarity reversal switch, for instance a conventional type of such switch which therefore requires no further explanations. Additionally, there is to be provided a blocking of the feedback loop in the fault-free condition, which likewise can be accomplished without difficulty, for instance by means of the excitation circuits which are necessary anyway and conventional. The reference location now oscillates —provided that there is not provided a cut-off— about the fault location and about a hysteresis region for the sign reversal, which hysteresis region encloses the fault location. Thus there is again attained in any case the desired fault location-localization while taking into account the momentarily valid reference location. However, the arrangement also can be carried out such that the iteration is stopped after a change in sign or after a predetermined number of sign changes.

As concerns the circuit structure details thereof will be further considered in conjunction with FIG. 2. A measurement or measuring station 2 having a voltage converter 2$a$ and current converter 2$b$ is provided at the measurement or measuring location $x = 0$ at an above-ground line having the longitudinal coordinate $x$ and consisting of a conductor 1. At the line there is indicated a fault location $x = z$ and a reference location $x = z_R$.

From the measurement station there are delivered a measurement voltage signal $u_m$ and a measurement current signal $i_m$—the latter via a constant factor multiplier 3— to a summing or adding amplifier 4 as well as parallel thereto a subtraction amplifier 5. By means of the constant factor multiplier 3 there is adjusted a ratio of the measurement voltage and measurement current corresponding to a predetermined resistance R, for instance the wave or characteristic impedance of the line. At the output of both amplifiers 4 and 5 there are thus formed the traveling wave signals $a(0,t)$ and $b(0,t)$ valid at the measurement location $x = 0$. As described in the aforementioned copending application, these traveling wave signals are, for instance, time shifted relative to one another and/or multiplied with different, especially mutually time shifted weighting functions in a modification circuit. There is especially to be considered a multiplication of the oppositely moving traveling wave signals having square-wave functions shifted with respect to one another, the momentary values of which change between null and a constant maximum value and therefore there can be sampled shifted sections from the temporal progression of the traveling wave signals. Thus there are formed the modified traveling wave signals $a'(t)$ and $b'(t)$. The weighting functions for both of the traveling wave signal channels are supplied in the form of square-wave pulses having mutually adjustable time position to a pair of adjustment or regulating inputs $P(z_R)$. Due to the time displacement of such square-wave pulses, and as explained in detail in the aforementioned copending application, it is possible to already determine or control a reference location on the line.

There follows an integration circuit 7 in which the modified traveling wave signals are integrated, for instance over defined time intervals. In particular, there comes under consideration a mutual time shifting of the integration time intervals for the oppositely moving traveling wave signals, whereby likewise there can be determined a reference location on the line, if necessary —and in the example under discussion this is assumed— in combination with a time shifted weighting in the modification circuit 6. The mutually shifted integration time intervals are again controllably infed via a pair of adjustment or regulating inputs $T(z_R)$ for both of the traveling wave signal channels. In this way there are formed two time integrals A, B of the oppositely moving traveling wave signal which are linked i.e. processed in an evaluation circuit 8 to an evaluation signal F.

Thus, in the embodiment illustrated in FIG. 2, which deviates from that shown in FIG. 1, there is not provided any multiple-integration for each wave propagation direction. Instead the required non-ambiguity of the correlation of the sign of the evaluation signal for fault direction with respect to the reference location is obtained by means of a phase detection branch. The branch is connected to the output of the amplifiers 4 and 5 and contains a filter 9 accentuating the dominant frequency of the traveling wave signals as well as a phase detector 10 supplied with this frequency component and the integration interval signals from the adjustment inputs T, and finally a sign reversal or inverting circuit 11 at the output channel of the evaluation circuit 8. At the output of the sign reversal circuit 11 there thus appears an evaluation signal $\Delta z$ which is correctly associated in sign to the momentary fault direction.

There follows the parallel channel 12, already discussed in conjunction with FIG. 1, of a comparison circuit in which the magnitude of the evaluation signal is compared with a predetermined boundary value $\Delta_0$. The binary output signal of the comparison circuit-parallel branch 12 controls by means of an AND-gate 13 the throughpassage of the clock pulses of a clock 15, synchronized by an excitation circuit 14, to a switching device 16 which during each closure duration of its contact, i.e. for the duration of each clock pulse, produces a displacement step signal for the reference location. Such displacement step $\Delta z_{Ri}$ is governed by the time integral of the evaluation signal $\Delta z$ over the constant clock pulse duration and thus is clearly dependent upon the amplitude of the evaluation signal. The generation of the displacement step signals however occurs only for such length of time until the boundary value $\Delta_0$ of the evaluation signal has not been fallen below. An integrator 17 adds the arriving displacement steps and thus forms a resultant reference location-difference signal $z_{Ri} - z_{RO} = \Sigma \Delta z_{Ri}$, which together with the reference location-initial value determines the momentarily valid reference location $z_{Ri}$.

The reference location-initial value $z_{RO}$ is tapped off at a potentiometer and delivered together with the previously mentioned difference signal to two control circuits 18 and 19 for generating the square-wave-weighting functions and the integration interval-switching signals. The corresponding pulse sequences and impulsed and thus synchronized by the excitation circuit 14 through the agency of a control connection Sy.

Figure 3:
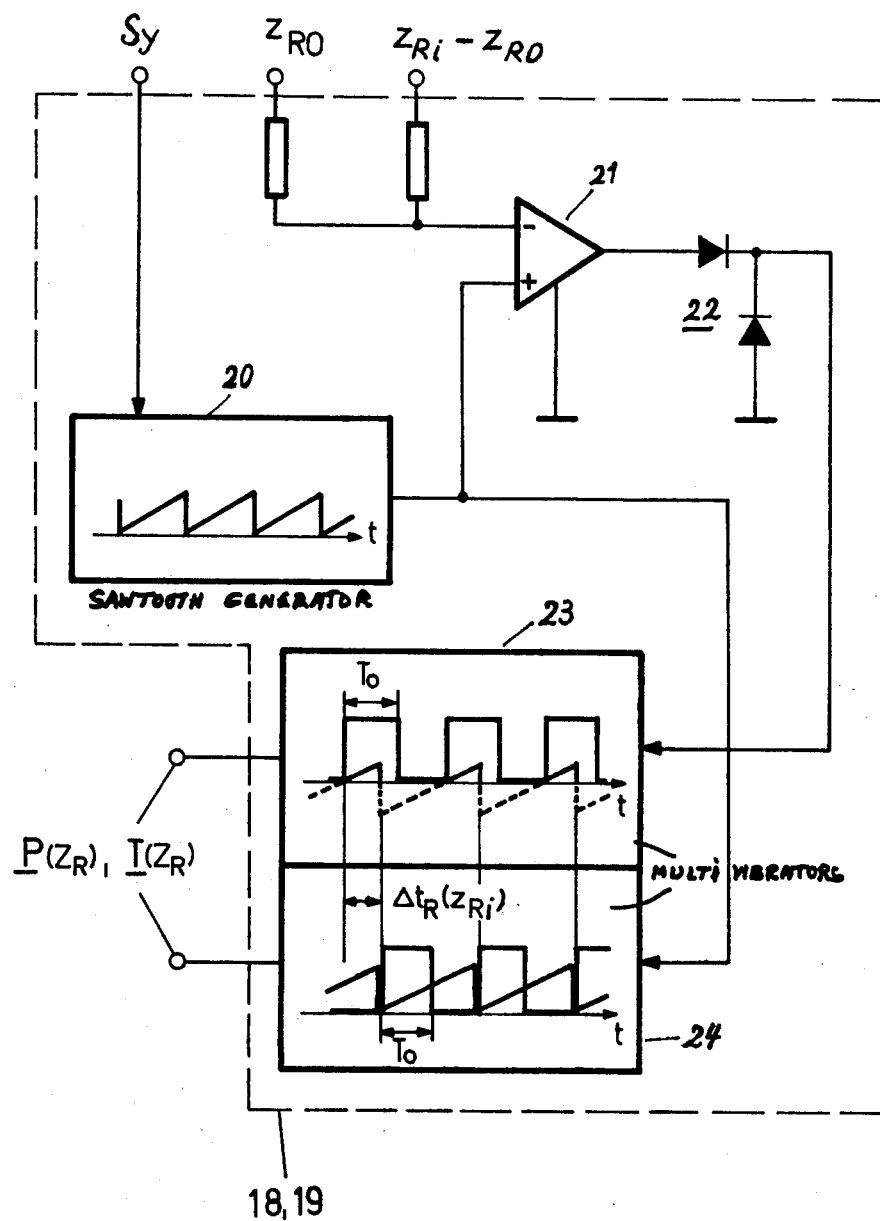
FIG. 3 is a circuit diagram of part of the apparatus of FIG. 2.

The circuit construction of the control circuits 18 and 19 for instance is the same and has been shown in greater detail in FIG. 3. From the output signal of a sawtooth generator 20 synchronized via the control connection Sy there is subtracted in an amplifier 21 the sum of the reference location-initial value $z_{RO}$ and reference location difference $z_{Ri} - z_{RO}$, i.e. $z_{Ri}$. The obtained signal is delivered via a diode circuit 22 to the trigger input of a monostable multivibrator 23 having a fixed pulse duration $T_o$. There is thus obtained the time diagram indicated in the block illustration of the multivibrator 23 of FIG. 3 of the shifted sawtooth pulses obtained by subtraction of the sum of the reference location-displacement steps and the output pulses of the multivibrator 23 having the pulse duration $T_0$ triggered by the start of the ascent of the positive residual sawteeth obtained by rectification. Moreover, the original sawtooth pulses of the generator 20 are directly delivered to a second monostable multivibrator 24 having the same pulse duration $T_0$. The output pulses of the latter are triggered by the start of the ascent of the original positive sawtooth pulses, so that in total the square-wave-output pulses of both multivibrators 23 and 24 are displaced by a time interval $\Delta t_R$ dependent upon the momentarily valid reference location $z_R$. These output signals therefore are directly suitable for the reference location adjustment and appropriate control of the adjustment or regulation inputs P and T of the modification circuit 6 and the integration circuit 7 according to FIG. 2, so that the iterative feedback loop is closed.

For determining the actual fault location $z$ in FIG. 2 there are further added in a summing or adding amplifier 25 the reference location-initial value $z_{RO}$ and the reference location-difference, i.e. the sum of the reference location-displacement steps, and the momentarily valid evaluation signal, i.e. the fault location-reference location difference $\Delta z$. In the special example of FIG. 2 stopping of the iterative reference location displacement occurs by means of the switching device 16 upon the evaluation signal following below the boundary value $\Delta_0$, whereby there is solved the fault localization.

Basically, the reference location shifting or displacement also can be realized with a continuously operating feedback loop, and no discrete displacement steps come into play. The iteration and the decision criterion for its termination are thus usable in corresponding manner.

While there are shown and described present preferred embodiments of the invention, it is to be distinctly understood that the invention is not limited thereto, but may be variously embodied and practiced within the scope of the following claims. ACCORDINGLY,

What I claim is:

1. An apparatus for fault localization on a line wherein an evaluation signal is formed from at least one measurement voltage signal derived from the line voltage and at least one measurement current signal derived from the line current, the evaluation signal characterizing the direction and/or the distance of a fault location with respect to a reference location on the line which can be controlled by at least one adjustment magnitude, a voltage- and current-measurement device provided at the measurement location, a signal processing- and evaluation circuit having an input side operatively connected in circuit with said voltage- and current-measurement device, said signal processing - and evaluation circuit having an output side delivering said evaluation signal, the signal processing- and evaluation circuit possessing at least one reference location-adjustment input for the infeed of said adjustment magnitude, and means providing an operative connection between an output of the evaluation circuit and the reference location-adjustment input, said means providing said operative connection changing the momentarily effective reference location adjustment as a function of said evaluation signal.

2. The apparatus as defined in claim 1, wherein the operative connection means between the output of the evaluation circuit and the reference location-adjustment input comprises a comparison circuit having an output and serving for determining the attainment of a predetermined boundary value of the distance determined by an evaluation signal between the fault location and the reference location, and a switching device controllably connected with the output of said comparison circuit.

3. The apparatus as defined in claim 1, wherein the operative connection means between the output of the evaluation circuit and the reference location-adjustment input comprises a polarity detector having an output and serving for determining a change in the direction of the fault location relative to the reference location, and a switching device which is controllably connected with the output of the polarity detector.

4. The apparatus as defined in claim 1, wherein the evaluation circuit comprises a summation circuit having inputs for a fault location-reference location difference signal and for a reference location-position signal.

* * * * *